United States Patent [19]

Bullinger et al.

[11] Patent Number: 4,947,395
[45] Date of Patent: Aug. 7, 1990

[54] BUS EXECUTED SCAN TESTING METHOD AND APPARATUS

[75] Inventors: Philip W. Bullinger; Thomas L. Langford, II; John W. Stewart, all of Wichita, Kans.

[73] Assignee: NCR Corporation, Dayton, Ohio

[21] Appl. No.: 308,917

[22] Filed: Feb. 10, 1989

[51] Int. Cl.$^5$ ............................................. G01R 31/28
[52] U.S. Cl. .................................. 371/22.3; 371/22.6
[58] Field of Search .................... 371/22.3, 22.6, 22.1, 371/15.1, 25.1; 324/73 R, 73 AT

[56] References Cited

U.S. PATENT DOCUMENTS

| | | | |
|---|---|---|---|
| 4,534,028 | 8/1985 | Trischler | 371/25 |
| 4,542,505 | 9/1985 | Binoeder et al. | 371/1 |
| 4,571,724 | 2/1986 | Belmondo et al. | 371/25 |
| 4,583,223 | 4/1986 | Inoue et al. | 371/20 |
| 4,594,544 | 6/1986 | Necoechea | 324/73 |
| 4,597,080 | 6/1986 | Thatte et al. | 371/25 |
| 4,604,746 | 8/1986 | Blum | 371/25 |
| 4,617,663 | 10/1986 | Lake et al. | 371/25 |
| 4,620,302 | 10/1986 | Binoeder et al. | 371/1 |
| 4,621,363 | 11/1986 | Blum | 371/25 |
| 4,635,261 | 1/1987 | Anderson et al. | 371/25 |
| 4,688,222 | 8/1987 | Blum | 371/25 |
| 4,692,691 | 9/1987 | Sueta | 324/73 R |
| 4,697,267 | 9/1987 | Wakai | 371/25 |
| 4,860,290 | 8/1989 | Daniels | 371/22.3 |
| 4,872,169 | 10/1989 | Whetsel | 371/22.3 |
| 4,897,838 | 1/1990 | Tateishi | 371/27.3 |

*Primary Examiner*—Jerry Smith
*Assistant Examiner*—Robert W. Beausoliel
*Attorney, Agent, or Firm*—Wilbert Hawk, Jr.; Stephen F. Jewett; Jack R. Penrod

[57] ABSTRACT

For LSI/VLSI integrated circuits which inherently have an address decoder and a data bus, a scan testing method and apparatus is presented which does not require additional pin connections to be dedicated for scan test implementation. Counter to the Joint Test Action Group approach, the present invention uses additional registers, multiplexers, and decoders in conjunction with the existing buses to provide test access to otherwise embedded layers of logic circuitry, without the addition of a single pin connection to a integrated circuit chip package. Further, since this test method and apparatus uses the data bus and registers just as the rest of the chip, slow and complex d.c. level shifting equipment is not required.

12 Claims, 5 Drawing Sheets

FIG.1A

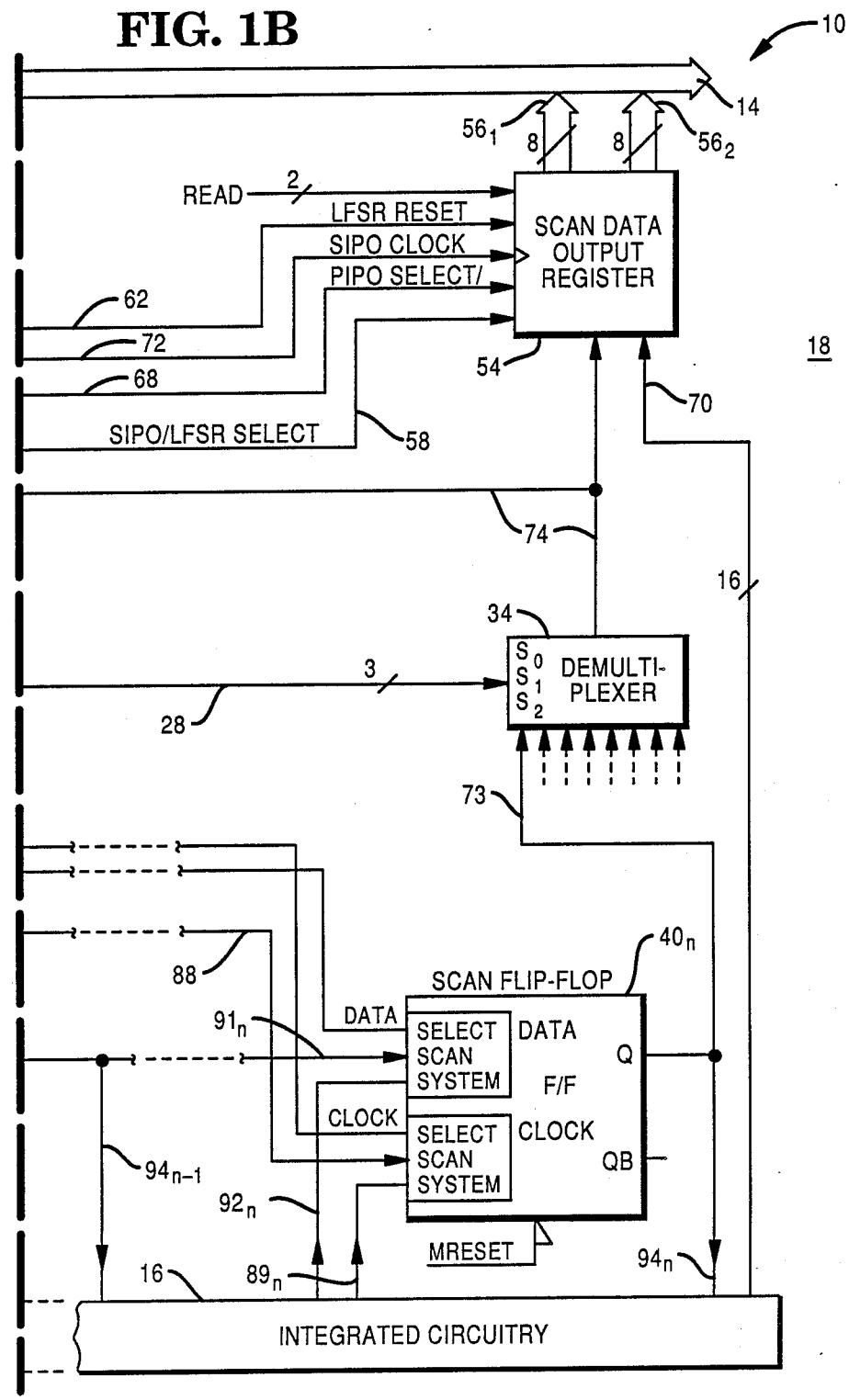

BUS EXECUTED SCAN TESTING METHOD AND APPARATUS

BACKGROUND OF THE INVENTION

The present invention relates to testing integrated circuits and more particularly to testing large scale and very large scale integrated circuits having relatively few pin connections.

The use of computer aided design/computer aided manufacturing (CAD/CAM) has had some profound effects on the world of integrated circuits. CAD/CAM has not only helped to design and develop individual circuit functions, such as counters, buffers, flip-flops, controllers, etc., but also provides the capability to store each individual circuit function as a 'cell' in a library. The cells then can be assembled and connected to form large and very large scale integrated circuits for performing complex functions. Thus, CAD/CAM has made possible the production of single integrated circuits which can replace entire printed circuit boards of simple, single function integrated circuits.

Microprocessors, random access memories, and application specific integrated circuits (ASICs) are common examples of large or very large integrated circuits having complex functionality. Each of these large integrated circuits, when completed, often requires between fourteen and two-hundred eighty pins to connect it to power and signal inputs and outputs from the printed circuit board upon which it is mounted.

The problem that arises is that the approximately ten thousand or more active circuit devices of each integrated circuit can only be accessed by the fourteen to two-hundred eighty pins required for power and signal inputs and outputs after the integrated circuit has been mounted and packaged. In complex integrated circuits this often means that some embedded logic functions cannot be tested, and other embedded logic functions can only be tested in combination with one or more levels of related logic functions.

One solution has been to add internal test circuitry in order to access test locations within the integrated circuit, and to add one or more pin connections for inputting and/or outputting test signals. But, there has always been a tradeoff between the cost of additional test circuitry and additional pin connections, on the one hand, and the money saved by improved testability during the production cycle and the maintenance cycle of a complex electronic unit.

A previous approach includes additional test circuitry on each integrated circuit which allows some access to embedded test locations. To keep the overall number of pin connections to a minimum, these integrated circuits use the input/output pin connections as access points for the test inputs and test outputs. However, to maintain a separation of the test circuits from the operating circuits, this type of integrated circuit uses special gating devices which are responsive to d.c. voltage level shifts. Thus, to perform a test, this type of integrated circuit must have certain d.c. voltage levels shifted. This type of operation, while improving testability with minimal increases to the number of pin connections, makes switching between test conditions and operating conditions slow and cumbersome. Additionally, d.c. level shift testing is very difficult to perform once the integrated circuit has been mounted onto a printed circuit board because of the effect of the level shifts on attached circuitry.

One conclusion reached by the integrated circuit industry is that some increase in the size of an integrated circuit chip is cost effective when access to otherwise embedded logic levels are provided to simplify the testing. This conclusion has been reached even though an increase in circuitry automatically means fewer chips are possible per wafer and a lower yield per lot because of a statistical increase per chip in the possibility of defects. The industry thus recognizes that the costs which would be expended on test equipment and test technicians during the production and maintenance cycles to assure proper operation of a complex integrated circuit may be greatly reduced by a relatively small increase in the overall cost of including internal test circuitry to the complex integrated circuit.

A second conclusion of the integrated circuit industry is that one or more pin connections must be added to each integrated circuit in order to provide input and output access for the test circuitry. This conclusion is reached by the industry even though the number of pin connections available to connect the internal functionality with the external printed circuit board often is the greatest limitation faced by the integrated circuit designer. This second industry conclusion is demonstrated by the acceptance of one or more test pin connections as a requirement for testing of large and very large scale integrated circuits by the Joint Test Action Group (JTAG) and the proposed IEEE P1149 standard.

It is an object of the present invention to provide a method for accessing embedded test locations within an integrated circuit without requiring one or more additional test pin connections.

It is another object of the present invention to provide a method for accessing embedded test locations within an integrated circuit without requiring a d.c. level shifting of one or more pin connections.

It is another object of this invention to provide an apparatus for accessing embedded test locations within an integrated circuit without requiring one or more additional test pin connections.

It is another object of this invention to provide an apparatus for accessing embedded test locations within an integrated circuit without requiring a d.c. level shifting of one or more pin connections.

SUMMARY OF THE INVENTION

Briefly stated, in accordance with one aspect of the invention, the foregoing objects are achieved by providing a method for testing a portion of an integrated circuit which has a register address decoder and a data bus. The method includes the steps of storing a scan path control word in a control register connected to the data bus, generating a scan clock signal in response to a plurality of write instructions to a preselected register address, receiving a scan data word from the data bus and storing the scan data word in a scan data register, shifting the scan data word out of the scan data register as a sequence of serial data bits in response to the scan clock signal, selecting a scan path according to the scan path control word and communicating the sequence of serial data bits over the scan path, assembling the sequence of serial data bits into a scan test word, scanning the scan test word into the portion of the integrated circuit, receiving a test response to the scan test word from the portion of the integrated circuit, and transmitting the test response to the data bus.

In accordance with another aspect of the invention, the foregoing objects are achieved by providing a test circuit for use in a digital integrated circuit having a register address decoder and a data bus. The test circuit has a control register connected to the data bus for receiving a scan path control word. The test circuit also has scan clock control logic that is connected to the register address decoder which generates a scan clock signal in response to a write instruction to a preselected register address. The test circuit further includes a scan data input register that is connected to the data bus for receiving a scan data word. The scan data input register has a shifted serial output which is shifted by the scan clock for outputting the scan data word as a sequence of serial bits. Connected to this scan data register is a scan path selector that is responsive to the scan path control word for selecting a scan path which communicates the sequence of serial bits to an assembling device. The assembling device assembles the sequence of serial bits into a scan test word for testing a portion of the integrated circuit. A scanning device is connected to the assembling device and scans the assembled scan test word into the portion of the integrated circuit under test. A receiving device is connected to the portion of the integrated circuit under test for receiving a test response to the scan test word. Moreover, an output register is connected to the receiving device for storing each test response and transmitting each test response to the data bus.

Various objects appear from a reading of the foregoing summary of the invention. Other objects and further scope of applicability of the present invention will appear from the following detailed description. It should be understood that the detailed description indicates one embodiment of the invention and is given by way of illustration only since changes and modifications may be made within the spirit and scope of the invention.

BRIEF DESCRIPTION OF THE DRAWINGS

While the specification concludes with the appended claims particularly pointing out and distinctly claiming the subject matter which is regarded as the invention, it is believed that the invention will be better understood from the following detailed description of the illustrative embodiment taken in conjunction with the accompanying drawings in which:

FIGS. 1A and 1B when joined along the dashed line are a simplified block diagram of a digital integrated circuit to which bus executed scan circuitry has been added in accordance with the present invention;

DETAILED DESCRIPTION OF A PREFERRED EMBODIMENT

Figure 1A:
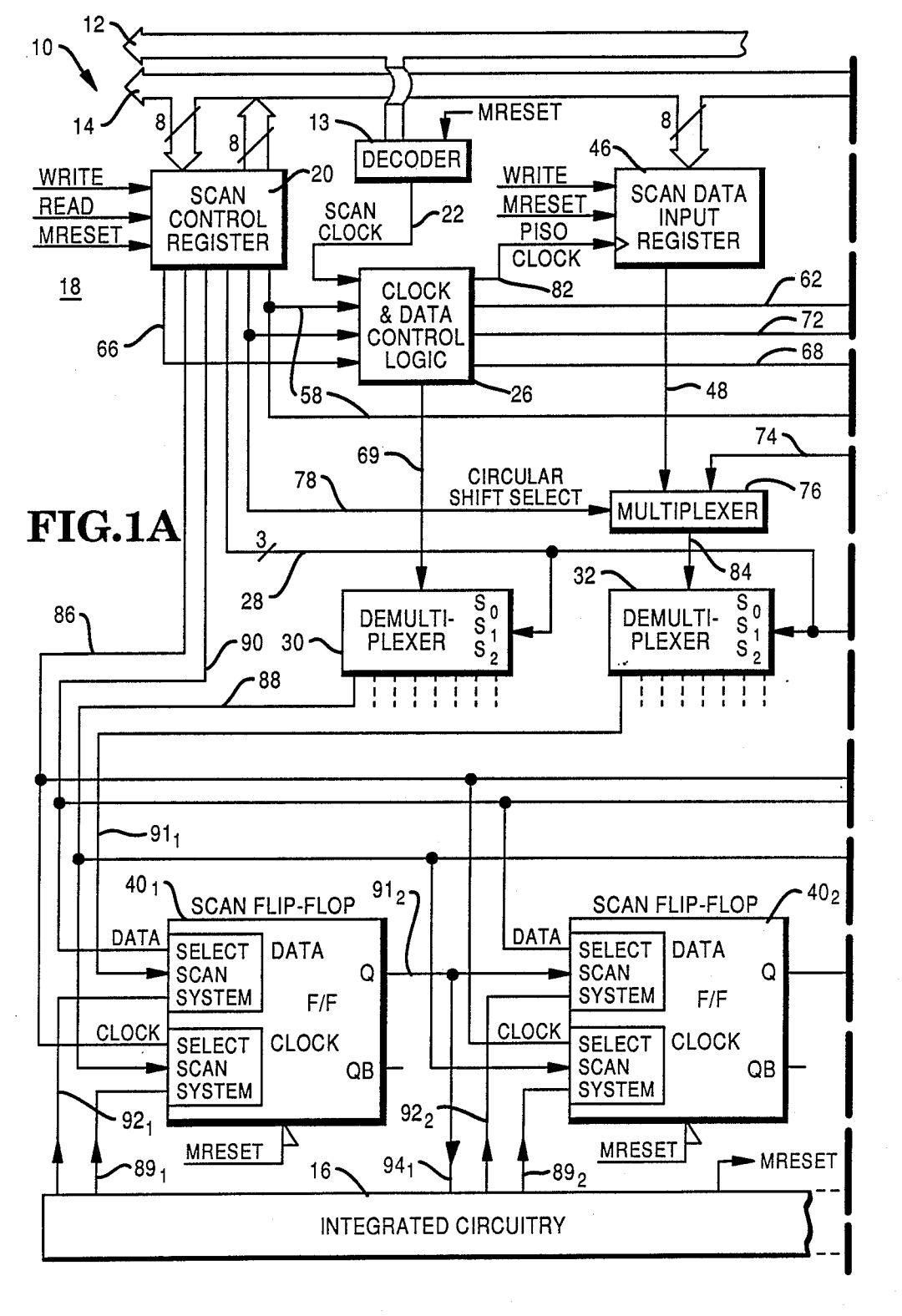
Figure 2:
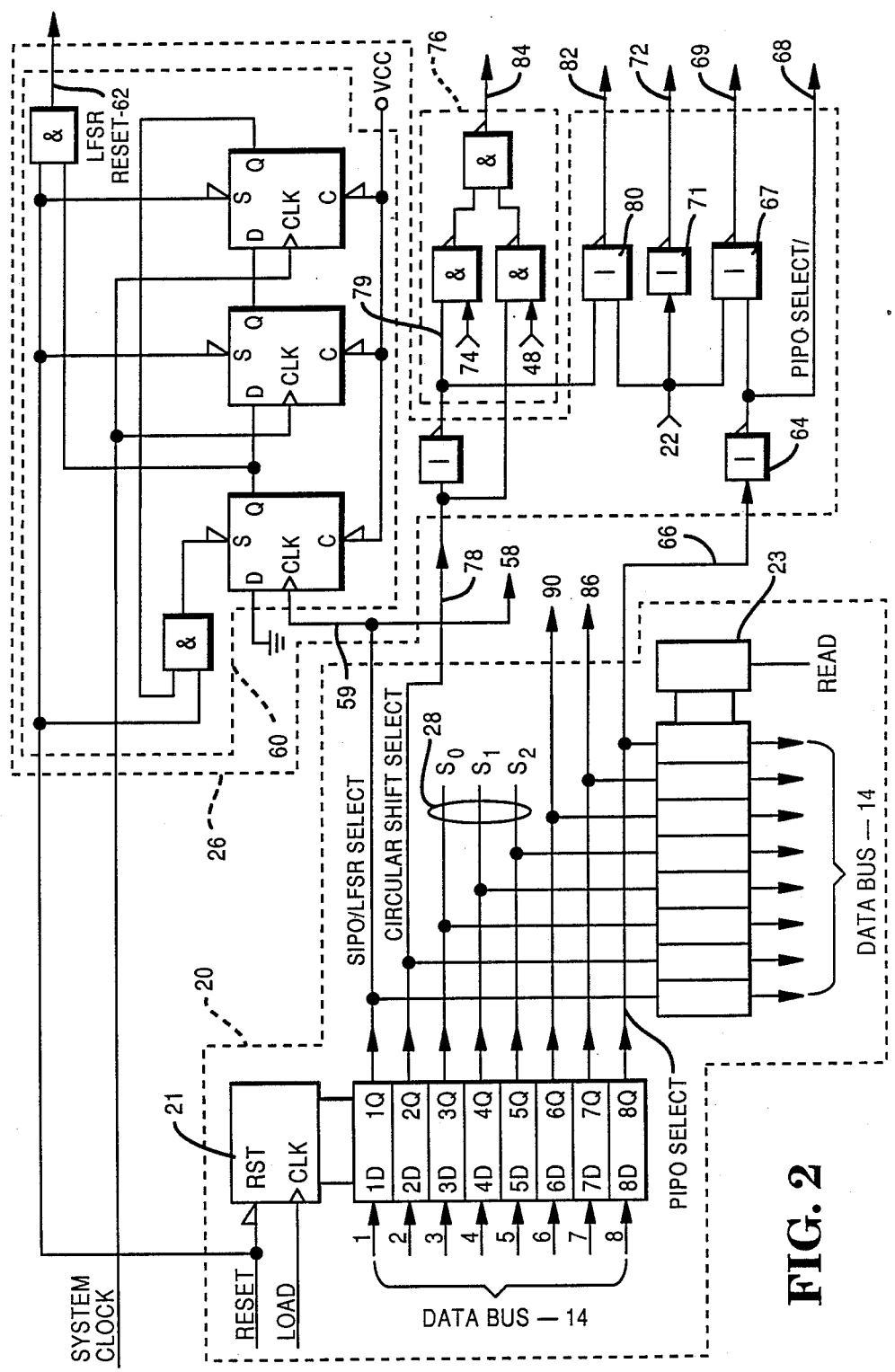
FIG. 2 is a detailed block diagram of the scan control register, and the clock and control logic shown in FIG. 1A.

Turning now to FIGS. 1A and 1B, there is shown in simplified block diagram form an integrated circuit 10 which is a conventional LSI/VLSI digital device. The integrated circuit 10 has a multi-conductor, parallel address bus 12 which is internally decoded by one or more address decoders 13 to address the various registers on the integrated circuit and to also decode memory mapped instructions sent to the integrated circuit 10 over the address bus 12. Further, the integrated circuit 10 has a multi-conductor, parallel data bus 14 to transmit multi-bit data words from an off-chip processor and/or controller to various registers of the integrated circuit 10, as well as receive multi-bit data words from one of the various registers of the integrated circuit 10 to the multi-conductor data bus 14.

The integrated circuit 10 provides one or more complex integrated logic functions 16 using synchronous logic, asynchronous logic or a combination of each. Some of the complex integrated logic functions 16 are directly connected to the address bus 12 and/or the data bus 14 (connections not shown), but these logic functions which are directly connected to the buses 12 and 14 are relatively easy to test and do not require additional test circuitry. Thus, the present invention concerns itself with integrated logic functions 16 which are embedded within the integrated circuit 10.

The bus executed scan testing apparatus 18 provides one or more controlled interfaces, which are referred to as scan paths, between the data bus 14 and the complex logic functions 16 which are embedded within the integrated circuit 10. Each scan path is defined and enabled by a sequence of words written into a scan control register 20. The sequence of words is selected because it works in synchronous and asynchronous circuits without inducing a metastable condition in any of the scan path and circuitry selected for the test, as will be explained later. The memory components, such as registers and flip-flops, are all provided with a master reset (MRESET) input. A processor/controller (not shown) may initiate a reset signal by writing to a control device, such as a memory mapped address of a decoder, such as decoder 13, or writing a master reset control register within the complex logic functions 16. When the master reset signal is received, most of the memory components reset to a preselected state as a prerequisite for pattern testing, such as testing for a certain test signature in response to a specific input or set of inputs. Some other registers use the master reset signal in conjunction with another control signal in order to reset the memory, as will be described later. The first word written into the scan control register 20 has a scan/system clock select bit set, and has all other control bits, which will be described below, reset. This allows a change over from the system clock, if any, to a scan clock before the set up of a scan path. This avoids any possible metastable condition which might be induced by a change over to a different clock.

As shown in FIG. 1A, the decoder 13 has one of its outputs connected by a line 22 to clock and data control logic 26. The decoder 13 strobes the line 22 with a LOW level scan clock signal whenever the processor/controller (not shown) writes to the memory mapped address for the scan clock signal.

Referring now to FIG. 2, details of the preferred embodiment of the scan control register 20 and the clock and data control logic 26 are described. The scan control register 20 has an octal D-type flip-flop register 21 to which control words are written via the data bus 14. The control word is stored in the flip-flops when the write strobe, sometimes called the LOAD strobe, goes inactive, and the contents of the scan control register 20 are available at the flip-flop outputs 1Q-8Q thereafter. The scan control register 20 also has a tri-state octal buffer 23 which has its inputs attached to the outputs 1Q-8Q. The octal buffer 23 provides an eight bit output to the data bus 14 whenever the octal buffer 23 is strobed by a pulse on its READ input. Thus the contents of the scan control register 20 may be READ as well as WRITTEN via the data bus 14.

The scan control register 20 stores a single control data byte. Each byte has six fields of various lengths, and each bit of each field drives a control level at a respective output 1Q-8Q. As mentioned previously, the first control data byte of a sequence has only the scan/system clock select bit, a single bit control field outputted to 7Q, set in order to avoid possible set up time problems. The second control byte of the sequence again has the scan/system clock select bit set, and a scan/system data select control bit, which also is a single bit field outputted to 6Q, set. The third control byte of the sequence has the scan/system clock select bit, the scan/system data select bit set, and one or more bits set in one of the other fields.

The remaining control fields of the control byte are a scan path select field $S_0S_1S_2$ outputted to 3Q, 4Q, and 5Q; a SIPO/LFSR select field outputted to 1Q, a circular shift select field outputted to 2Q, and a parallel-in-parallel-out (PIPO) mode (a monitor mode) select field outputted to 8Q.

Referring back to FIGS. 1A and 1B, the output of the scan path select field is connected by a three conductor bus 28 to select inputs of eight-to-one demultiplexer 30, eight-to-one demultiplexer 32, and one-to-eight multiplexer 34. The demultiplexers 30, 32 act as single pole—eight position switches with each switch selecting a scan path to a respective input of a scan flip-flop $40_1$, $40_2$ for its respective scan test input. The multiplexer 34 also acts as a single pole—eight position switch, except that in this case, it is selecting a scan path from an output of a scan flip-flop $40_n$ to the multiplexer 34. As indicated by the dashed lines, other embodiments of the invention, having more demultiplexers, multiplexers and scan flip-flops to provide additional scan paths are contemplated, and all such embodiments within the spirit and the scope of the appended claims are deemed to be part of the present invention. Further, each demultiplexer 30, 32 and each multiplexer 34 may have up to eight scan paths attached thereto, but only one exemplary scan path is shown for simplicity.

After the scan path is selected, the scan data is clocked along the selected scan path to the scan flip-flops $40_1$, $40_2$, ... $40_n$. Although the preferred embodiment provides other test modes, as will be described below, the scan data often consists of one or more bytes of data written from the data bus 14 into a scan data input register 46. The scan data input register 46 is a parallel-in-serial-out (PISO) shift register which either shifts or rotates the byte stored within the register such that a succeeding bit drives the serial scan data output line 48.

Figure 3:
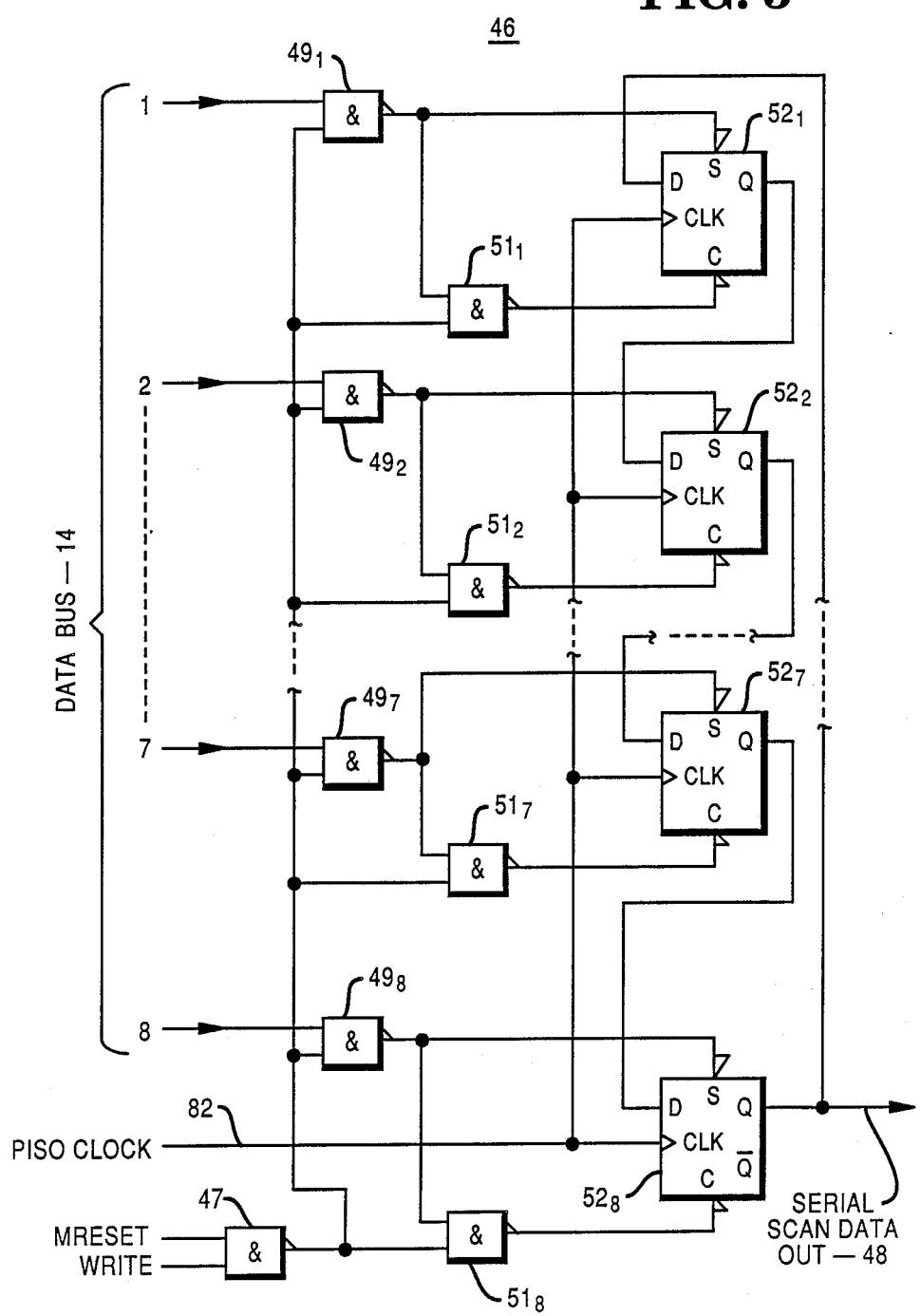
FIG. 3 is a detailed block diagram of the scan data input register shown in FIG. 1A.

FIG. 3 shows the scan data input register 46 in detail. An enabling NAND gate 47 enables data to be inputted from the data bus 14 to storage in the scan data input register 46 when either the MRESET or the WRITE input is driven LOW. Each line of the data bus 14 is connected to one input of a respective NAND gate $49_1$ ... $49_8$, and the output of enabling NAND gate 47 is a second input of each respective NAND gate $49_1$ ... $49_8$. The output of each NAND gate $49_1$ ... $49_8$, which is inverted from each data bus input, is connected to an inverting asynchronous set input of a respective D-type flip-flop $52_1$ ... $52_8$. Further, the output of each NAND gate $49_1$ ... $49_8$ is also connected to a respective first input of NAND gates $51_1$ ... $51_8$. The second input of NAND gates $51_1$ ... $51_8$ is each connected to the output of enabling NAND 47. When enabled by a HIGH level from NAND 47, each NAND gate $51_1$ ... $51_8$ inverts the input from its respective NAND gate $49_1$ ... $49_8$ output and drives an inverting asynchronous reset of the respective D-type flip-flop $52_1$ ... $52_8$. This arrangement ensures that the asynchronous set and clear inputs of each flip-flop $52_1$ ... $52_8$ are driven by complementary logic signals to unambiguously WRITE the state thereof, according to the scan data input byte from the data bus 14.

The D-input of flip-flop $52_8$ is connected to the Q output of flip-flop $52_7$, the D-input of flip-flop $52_7$ is connected to the next flip-flop Q output, and so forth. The D-input of flip-flop $52_1$ is connected to the Q output of flip-flop $52_8$. According to this arrangement, a scan data input byte that is WRITTEN into the flip-flops $52_1$ ... $52_8$ asynchronously, is outputted to the serial data out line 48. Each scan data input byte is shifted to the highest bit position of the register 46 by the parallel-in-serial-out clock. As each bit is shifted to the most significant position, i.e. flip-flop $52_8$, each bit is outputted to serial scan data output line 48 and inputted to the least significant bit position, i.e. flip-flop $52_1$. In this manner an end around shift register is formed.

The scan data input register 46 may be reset to a value inputted via the data bus 14, in order to initialize or clear it, by driving either its MRESET input or its WRITE input with LOW levels, which is an asynchronous reset or clear. An initialization such as this is usually performed before each SIPO/LFSR select scan test in order to start from a easily repeatable and well defined register content.

Referring back to FIGS. 1A and 1B, a scan data output register 54 is connected to the the data bus 14 by eight bit output buses $56_1$, $56_2$. The scan data output register 54 has sixteen storage locations, which are partitioned into two equal groups of eight locations each. Each group of storage locations has its own READ input, such that the first group may be READ out via output bus $56_1$ by strobing one of the READ inputs, and the second group may be READ out via output bus $56_2$ by strobing the second of the READ inputs.

Figure 4:
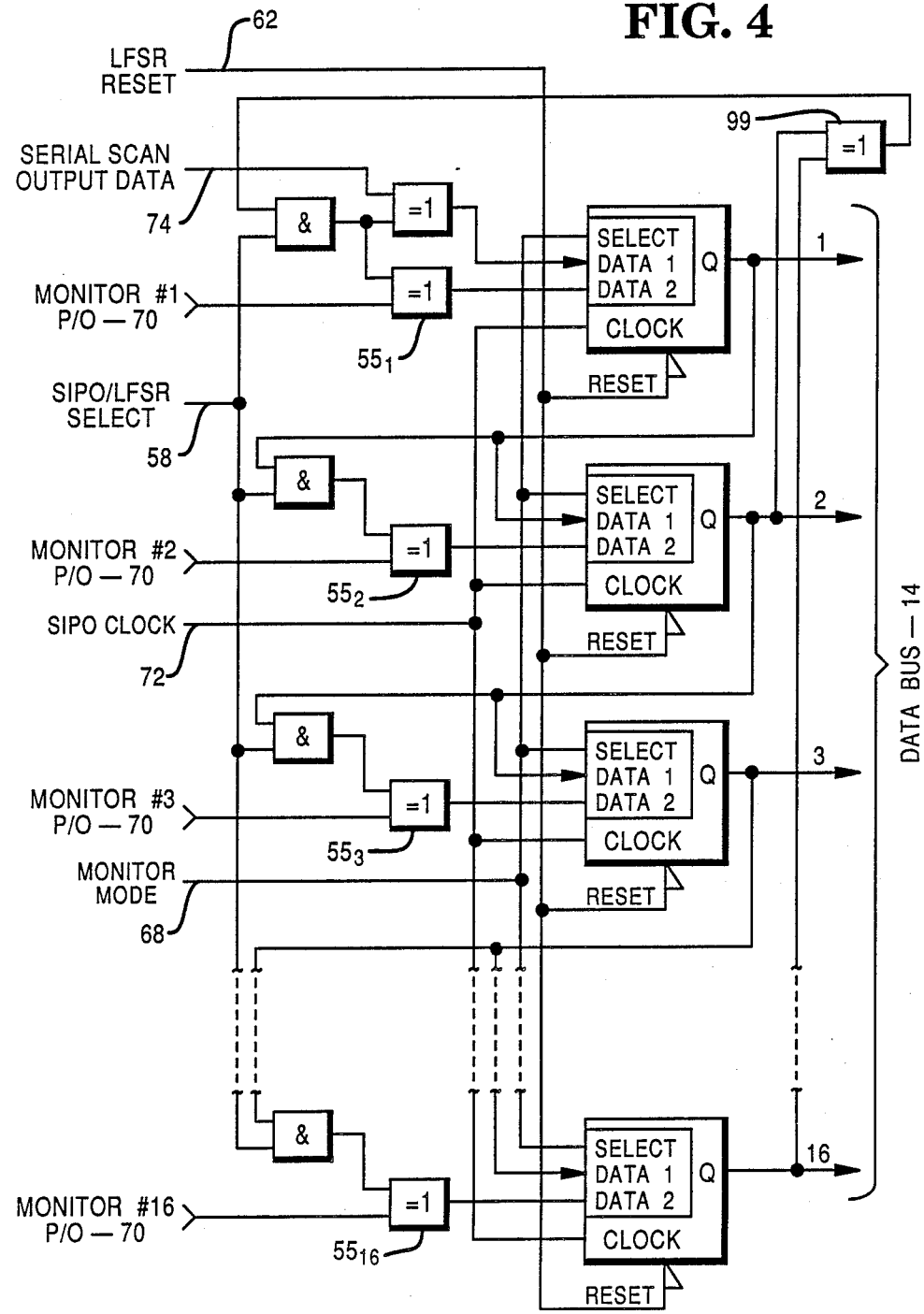
FIG. 4 is a detailed block diagram of the scan data output register shown in FIG. 1B.

Further details of the data output register 54 are shown in FIG. 4, which is a simplified block diagram. In order to increase the overall testing flexibility, the scan data output register 54 has two data input modes: parallel-in-parallel-out (PIPO) mode, and serial-in-parallel-out (SIPO) mode. The current data input mode is controlled by the SIPO/LFSR select bit and the PIPO bit. The SIPO/LFSR select output of scan control register 20 (shown in FIG. 1A and FIG. 2) is connected to the scan data output register SIPO/LFSR input by line 58. This control bit enables/disables Exclusive OR gates $55_1$ ... $55_{16}$ (shown in FIG. 4) to perform data compression. The SIPO/LFSR select output is also connected to a trigger circuit 60 (shown in FIG. 2) of the clock and data control logic unit 26 via line 59. The trigger circuit 60, generates a linear feedback shift register (LFSR) reset signal which asynchronously resets the sixteen memory locations of the scan data output register 54 (shown in FIG. 4) each time the SIPO/LFSR select signal changes from the SIPO select level to the LFSR select level. This LFSR reset output of the trigger circuit 60 is connected to a LFSR reset input of scan data output register 54 via line 62 (shown in FIG. 1B). The trigger circuit 60 (shown in FIG. 2) insures that the LFSR reset signal is at least one system clock period in duration. The LFSR is reset to provide a predetermined, consistent initial shift register value for serial and/or data compression testing, which will be explained below.

As shown in FIG. 2, the PIPO select bit of register 20 is connected to an inverter 64 via line 66. The output of the inverter 64 of the clock and data control logic 26, which is a PIPO SEL/ signal, is connected to one input of the scan data output register 54 (see FIG. 1B) via line 68. When the PIPO select bit is set to a LOW level in the scan data input register 20, it is inverted inverter 64 such that PIPO SEL/ is a HIGH. When PIPO SEL/ is HIGH, the sixteen parallel inputs to the scan data output register 54 from the integrated circuitry 16 are selected. These sixteen parallel inputs are connected to the integrated circuitry 16 via multi-conductor line 70 (see FIG. 1B). Because this mode provides storage for up to sixteen outputs from the integrated circuitry 16, this is also referred to as the monitor mode. When the PIPO select bit is set to a HIGH level, it is inverted by inverter 64, such that PIPO SEL/ is a LOW, which selects the serial data shifted serially out of scan flip-flop $40n$ and through multiplexer 34 via lines 73 and 74 respectively to the serial scan output data input.

Referring back to FIG. 2, when the PIPO select bit is at a HIGH level, it is inverted to a LOW level by inverter 64 and connected to an input of a NOR gate 67, the other input of which is connected to the scan clock via line 22. The LOW level out of inverter 64 enables the NOR gate 67 to provide on line 69 an active HIGH, inverted scan clock signal. This signal is switched by the demultiplexer 30 to the scan flip-flops $40_1 \ldots 40_n$ (shown in FIG. 1A).

The scan clock line 22, as shown in FIG. 2, is connected to an input of an inverter 71, and the SIPO clock output generated thereby is connected by line 72 to the SIPO clock input of the scan data output register 54.

The circular shift select bit, the 2Q output of the scan data input register 20, is connected to a two-to-one multiplexer 76 via a line 78. A second line 79 connects the inverted circular shift select bit to an input of a NOR gate 80. A second input of the NOR gate 80 is connected to the scan clock output line 22 of decoder 13. The circular shift select bit operates as an enable for the scan clock to be switched and become the PISO clock output when circular shift is not selected. The PISO clock output of clock and data control logic unit 26 is connected to the scan data input register 46 via line 82.

The circular shift bit, thus, not only controls the PISO clock output on line 82, but also the selection of the serial data output from scan data input register 46 via line 48, or the serial test data output from the multiplexer 34 (see FIG. 1B) on line 74. The latter selection is the circular shift test selection, as shown in FIGS. 1A and 1B, which is characterized by the fact that the system output on line 74 is switched back as an input by multiplexer 76. When the circular shift is not enabled, the PISO clock on line 82 shifts each data word stored in the scan data input register 46 onto line 48 one bit at a time to the multiplexer 76. When the circular shift is not enabled, the input on line 48 is the one that is selected to be the output of multiplexer 76 on line 84.

The scan/system clock select bit is connected by a line 86 (FIGS. 1A and 1B) to a select input of a two-to-one clock multiplexer which is a part of every scan flip-flop $40_1 \ldots 40_n$. The scan/system clock select bit output controls the flip-flops $40_1 \ldots 40_n$ to select either the system clock or the scan clock as flip-flop clock inputs. The scan clock signal is connected from the demultiplexer 30 to scan clock inputs of flip-flops $40_1 \ldots 40_n$ by line 88. The system clock is connected to the system clock inputs of flip-flops $40_1 \ldots 40_n$ by lines $89_1 \ldots 89_n$.

The scan/system data select control bit is connected by line 90 to a select input of a two-to-one data multiplexer which is also a part of every scan flip-flop $40_1 \ldots 40_n$. The scan/system data select bit output controls the flip-flops $40_1 \ldots 40_n$ to select either the system data or the scan data as flip-flop data inputs. The scan data input signal is connected from demultiplexer 32 to the data input of flip-flop $40_1$ via line $91_1$. Each subsequent scan flip-flop $40_2 \ldots 40_n$ has its input scan data input connected to the Q output of the immediately preceding scan flip-flop $40_1 \ldots 40_{n-1}$ via a respective line $91_2 \ldots 91_n$. The system data inputs to the flip-flops $40_1 \ldots 40_n$ are connected to outputs of the integrated logic functions 16 via lines $92_1 \ldots 92_n$.

In addition, each Q output of the scan flip-flops $40_1 \ldots 40_n$ is connected to a respective input of the integrated logic functions 16 via one of the respective lines $94_1 \ldots 94_n$. Each of the lines $94_1 \ldots 94_n$ supplies one or more test words or vectors to its respective portion of the logic functions of the integrated circuitry 16 as required.

OPERATION

The bus executed scan testing apparatus 18 is controlled by an external processor/controller (not shown) to perform various tests on the integrated logic functions 16. As mentioned previously, each test sequence is initiated by writing the first control data byte with only the scan/system clock select bit active in order to avoid possible set up problems. The second control byte of the sequence again has the scan/system clock select bit active, and the scan/system data select control bit active which selects the data input to the scan flip-flops $40_1 \ldots 40_n$ to be the data serially clocked out of the scan data register 46 through the multiplexer 76 and the demultiplexer 32. The third control byte of the sequence has the scan/system clock select bit, the scan/system data select bit set, and one or more bits set in one of the other fields. The scan path select field selects one of eight predetermined scan paths according to the value of its three bit field. If the circular select bit is active, then the multiplexer 76 selects the output of the scan flip-flop $40_n$ on line 73 switched through multiplexer 34 (assuming the appropriate scan path has been selected) as a feedback input. Circular scanning is valuable because the results of one test can be circulated around and used as the next scan test input, or the pretest condition of the portion of the integrated circuit 16 under test may be circularly shifted out for diagnostics and shifted back to its previous condition if no error was detected.

When a scan test mode with the circular test not selected is selected, the scan test data input words are serially shifted from the scan input data register 46, though the selected scan path $91_1 \ldots 91_n$ to fill as many scan flip-flops $40_1 \ldots 40_n$ as required. If necessary, two or more words may be transferred to scan data input register 46 and shifted to the flip-flops $40_1 \ldots 40_n$. The shifting is performed under the control of the PISO clock which is derived from the scan clock. Once the input scan data is assembled into the scan flip-flops $40_1 \ldots 40_n$, then the scan/system clock may be released for one or more cycles to allow the data to be clocked out of the scan flip-flops $40_1 \ldots 40_n$ to provide a system response to the test input. Further, by also having the scan flip-flops $40_1 \ldots 40_n$ switch from scan input data to system data supplied on line $89_1 \ldots 89_n$, then the scan flip-flops $40_1 \ldots 40_n$ may be used to store a multi-bit output, which can subsequently be shifted out of scan flip-flop $40_n$ on line 73 and ultimately to the SIPO input of the scan data output register 54 in a manner very similar to the serial shifting out of scan data register 46.

The scan data output register 54 is sixteen bits wide, and thus can serially store test responses having up to sixteen bits. The scan data register 54 also has a logical feedback device 99, ( see FIG. 4 where this device is a multiple input Exclusive OR gate) by which two or more bits in the scan data output shift register 54 may be logically combined with the first bit currently being shifted in. In this manner, numerous cycles of test data may be compressed into a unique signature which could be checked for a pass/fail result at the end of such a test. This data compression operation is enabled/disabled by the logic level to the SIPO/LFSR select input via line 58.

Referring to FIGS. 1A and 1B, if the PIPO/monitor mode, instead of the SIPO mode is selected, then whatever is in the flip-flops $40_1 \ldots 40_n$ is applied to the inputs $94_1 \ldots 94_n$, and after one or more system clock periods, the responses from sixteen monitor points within the integrated functions 16 are transmitted via the multi-conductor line 70 to the scan data output register 54. This data is latched into the scan data output register by the SIPO clock signal. This parallel data may also be compressed into a unique signature.

The results of each scan test, regardless of what type it is, may be READ out of the scan data register 54 by strobing a first READ line to strobe out bits 1 to 8 in parallel, and by strobing the second READ line to READ to strobe out bits 9 to 16 in parallel.

Thus, it will now be understood that there has been disclosed a bus executed scan testing method and apparatus which provides access to logical circuitry embedded deep within a complex integrated circuit without requiring the addition of a single external pin connection, or the use of d.c. level shifting of one or more of the input/output pins. While the invention has been particularly illustrated and described with reference to a preferred embodiment thereof, it will be understood by those skilled in the art that various changes in form, details, and applications may be made therein. It is accordingly intended that the appended claims shall cover all such changes in form, details and applications which do not depart from the true spirit and scope of the invention.

What is claimed as new and desired to be secured by Letters Patent of the United States is:

1. For use in a digital integrated circuit having a plurality of internal scan data inputs, a plurality of scan data outputs, and a data bus; a test circuit comprising:
    means for receiving a control word from the data bus;
    means responsive to said control word receiving means for selecting a scan path;
    means for receiving a scan data input word from the data bus;
    means for scanning the scan data input word into the plurality of internal scan data inputs of the digital integrated circuit via the selected scan path; and
    means for receiving a scan data output word responsive to the scan data input word from the plurality of scan data outputs of the digital integrated circuit.

2. For use in a digital integrated circuit having an address decoder and a data bus, a test circuit comprising:
    a control register connected to the data bus for receiving a scan path control word;
    scan clock means for generating a scan clock signal in response to a write instruction to a preselected address decoded by the decoder;
    scan data input register means connected to the data bus for receiving a scan data word therefrom;
    the scan data input register having a shifted serial output responsive to said scan clock signal for outputting said scan data word as a sequence of serial bits;
    scan path selection means connected to said scan data register means and responsive to said scan path control word for selecting a scan path communicating said sequence of serial bits to an output thereof;
    assembling means connected to said output of said scan path selection means for assembling said sequence of serial bits into a scan test word for testing a portion of the integrated circuit;
    means connected to said assembling means for scanning said scan test word into said portion of the integrated circuit;
    output means connected to said portion of the integrated circuit for receiving a test response to said scan test word therefrom; and
    output register means connected to said output means for storing said test response and transmitting said test response to the data bus.

3. The test circuit set forth in claim 2, wherein said output means is connected to said output register means by a multi-conductor bus which connects a plurality of monitor bits within said test response to a plurality of storage locations within said output register means for storing said test response therein in a parallel data transfer.

4. The test circuit set forth in claim 2, wherein said output means is connected to said output register means by a single-conductor bus which serially transfers said test response to a plurality of storage locations within said output register means for storing said test response therein.

5. For use in a digital integrated circuit having a parallel bus which transfers multiplexed address words and a data words, a test circuit comprising:
    a control register connected to said parallel bus and for receiving a scan path control word;
    scan clock means connected to said parallel bus for generating a scan clock signal in response to a write instruction to a preselected address word;
    scan data input register means connected to said parallel bus for receiving a scan data word therefrom;
    said scan data input register having a shifted serial output responsive to said scan clock signal for outputting said scan data word as a sequence of serial bits;
    scan path selection means connected to said scan data register means and responsive to said scan path control word for selecting a scan path communicating said sequence of serial bits to an output thereof;
    assembling means connected to said output of said scan path selection means for assembling said sequence of serial bits into a scan test word for testing a portion of the integrated circuit;

means connected to said assembling means for scanning said scan test word into said portion of the integrated circuit;

output means connected to said portion of the integrated circuit for receiving a test response to said scan test word therefrom; and output register means connected to said output means for storing said test response and transmitting said test response via said parallel bus.

6. The test circuit set forth in claim 5, wherein said output means is connected to said output register means by a multi-conductor bus which connects a plurality of monitor bits within said test response to a plurality of storage locations within said output register means for storing said test response therein in a parallel data transfer.

7. The test circuit set forth in claim 5, wherein said output means is connected to said output register means by a single-conductor bus which serially transfers said test response to a plurality of storage locations within said output register means for storing said test response therein.

8. For use in a digital integrated circuit having an address decoder and a data bus a test circuit comprising:

a control register having a plurality of parallel inputs, each connected to a respective control storage location, and each control storage location connected to a respective output, for receiving a control bit into at least one of said locations;

scan clock means connected to the address decoder for generating a scan clock output in response to a write instruction to a preselected address;

scan data input register means, having a plurality of data storage locations, connected to the data bus for receiving a scan data word therefrom;

said scan data input register having a shifted serial output controlled by said scan clock means for outputting said scan data word as a sequence of serial bits;

scan path selection means responsive to at least one of said control bits connected to said scan data register means for receiving and outputting said sequence of serial bits to a selected scan path;

means for assembling said sequence of serial bits into a scan data word for testing a digital logic element of said integrated circuit;

scan path means connected to said assembling means for scanning said scan data word as a multi-bit input into said digital logic element of the integrated circuit;

means connected to the integrated circuit for receiving an output of said digital logic element responsive to said multi-bit input; and output register means connected to said digital logic element to receive said output therefrom for storing said output and transmitting said output to the data bus.

9. The test circuit set forth in claim 8, wherein said output means is connected to said output register means by a multi-conductor bus which connects a plurality of monitor bits within said test response to a plurality of storage locations within said output register means for storing said test response therein in a parallel data word transfer.

10. The test circuit set forth in claim 8, wherein said output means is connected to said output register means by a single-conductor bus which serially transfers said test response to a plurality of storage locations within said output register means for storing said test response therein.

11. A method for testing a portion of an integrated circuit having an address decoder and a data bus, comprising the steps of:

a. storing a scan path control word in a control register connected to the data bus;

b. generating a scan clock signal in response to a plurality of write instructions to a preselected address;

c. receiving a scan data word from the data bus and storing said scan data word in a scan data register;

d. shifting said scan data word out of said scan data register as a sequence of serial data bits in response to said scan clock signal;

e. selecting a scan path according to said scan path control word and communicating said sequence of serial data bits over said scan path;

f. assembling said sequence of serial data bits into a scan test word;

g. scanning said scan test word into said portion of the integrated circuit;

h. receiving a first test response to said scan test word from said portion of the integrated circuit; and i. transmitting said test response to the data bus.

12. The method as set forth in claim 11, after step h, further comprising the steps of:

receiving a second scan data word from the data bus and storing said second scan data word in said scan data register;

shifting said second scan data word out of said scan data register as a second sequence of serial data bits in response to said scan clock signal;

assembling said second sequence of serial data bits into a second scan test word;

scanning said second scan test word into said portion of the integrated circuit;

receiving a second test response to said second scan test word from said portion of the integrated circuit; and logically combining said second test response with said first rest response into a rest response.

* * * * *

UNITED STATES PATENT AND TRADEMARK OFFICE
CERTIFICATE OF CORRECTION

PATENT NO. : 4,947,395
DATED : August 7, 1990
INVENTOR(S) : Philip W. Bullinger et al.

It is certified that error appears in the above-identified patent and that said Letters Patent is hereby corrected as shown below:

Column 12, line 40, "as" should be deleted.

Column 12, line 56, "rest" should be --test--.

Column 12, line 56, "rest" should be --test--.

Signed and Sealed this

Seventh Day of January, 1992

Attest:

HARRY F. MANBECK, JR.

Attesting Officer  Commissioner of Patents and Trademarks